United States Patent
He et al.

(10) Patent No.: US 12,400,927 B2
(45) Date of Patent: Aug. 26, 2025

(54) HIGH-MOBILITY-ELECTRON TRANSISTORS HAVING HEAT DISSIPATING STRUCTURES

(71) Applicant: GlobalFoundries U.S. INC., Malta, NY (US)

(72) Inventors: Zhong-Xiang He, Essex Junction, VT (US); Ramsey Hazbun, Colchester, VT (US); Rajendran Krishnasamy, Essex Junction, VT (US); Johnatan Avraham Kantarovsky, South Burlington, VT (US); Michel Abou-Khalil, Essex Junction, VT (US); Richard Rassel, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 528 days.

(21) Appl. No.: 17/808,110

(22) Filed: Jun. 22, 2022

(65) Prior Publication Data
US 2023/0420326 A1    Dec. 28, 2023

(51) Int. Cl.
| | |
|---|---|
| H01L 23/367 | (2006.01) |
| H01L 21/48 | (2006.01) |
| H01L 23/48 | (2006.01) |
| H10D 30/47 | (2025.01) |

(52) U.S. Cl.
CPC ........ *H01L 23/367* (2013.01); *H01L 21/4882* (2013.01); *H01L 23/481* (2013.01); *H10D 30/47* (2025.01)

(58) Field of Classification Search
CPC . H01L 23/367; H01L 21/4882; H01L 23/481; H01L 23/3677; H01L 23/3732; H10D 30/47; H10D 30/4732; H10D 64/254; H10D 30/475; H10D 62/117
See application file for complete search history.

(56) References Cited

U.S. PATENT DOCUMENTS

| | | | | |
|---|---|---|---|---|
| 6,744,072 B2 * | 6/2004 | Romano | ............. | H01S 5/02461 257/85 |
| 8,575,657 B2 * | 11/2013 | Gambin | ............. | H01L 23/3732 257/706 |

OTHER PUBLICATIONS

Srikant Kumar Mohanty et al., Thermal Management of GaN-on-Si High Electron Mobility Transistor by Copper Filled Micro-Trench Structure, Scientific Reports, 2019, pp. 1-9, vol. 9—Issue No. 19691, The Authors.

Daniel Shoemaker et al., Diamond-Incorporated Flip-Chip Integration for Thermal Management of GaN and Ultra-Wide Bandgap RF Power Amplifiers, IEEE Transactions on Components, Packaging and Manufacturing Technology, Aug. 2021, pp. 1177-1186, vol. 11—Issue No. 8, IEEE.

* cited by examiner

*Primary Examiner* — Patricia D Valenzuela
(74) *Attorney, Agent, or Firm* — Francois Pagette

(57) ABSTRACT

A semiconductor device is provided. The semiconductor device includes a substrate, a semiconductor layer, a device layer, and heat dissipating structures. The semiconductor layer is over the substrate and the device layer is over the semiconductor layer. The device layer includes a first ohmic contact and a second ohmic contact. The heat dissipating structures are at least through the substrate and the semiconductor layer, and between the first ohmic contact and the second ohmic contact.

14 Claims, 3 Drawing Sheets

HIGH-MOBILITY-ELECTRON TRANSISTORS HAVING HEAT DISSIPATING STRUCTURES

TECHNICAL FIELD

The present disclosure relates generally to semiconductor devices, and more particularly to high-electron-mobility transistors (HEMTs) with heat dissipating structures and methods of forming the same.

BACKGROUND

Semiconductor devices, such as high-electron-mobility transistors (HEMTs), have a desirable intrinsic capacity for handling large current and power densities due to the presence of a junction between two semiconductor materials with different band gaps. HEMTs are able to operate at higher frequencies and higher temperatures than the typical field-effect transistors (FETs), for example, metal-oxide-semiconductor FETs (MOSFETs), and are often used in high-frequency products, for example, cell phones, satellite television receivers, voltage converters, and radar equipment.

One of the main limitations of using HEMTs is the self-heating effect during operation, which degrades electrical performance and causes reliability problems. For example, when the temperature of the HEMT exceeds a threshold temperature, there is a reduction in carrier mobility, as well as the average lifespan thereof.

Therefore, solutions are provided to overcome, or at least ameliorate, the disadvantages described above.

SUMMARY

To achieve the foregoing and other aspects of the present disclosure, high-electron-mobility transistors (HEMTs) with heat dissipation structures and methods of forming the same are presented.

According to an aspect of the present disclosure, a semiconductor device is provided. The semiconductor device includes a substrate, a semiconductor layer, a device layer, and a heat dissipating structure. The semiconductor layer is over the substrate and the device layer is over the semiconductor layer. The device layer includes a first ohmic contact and a second ohmic contact. The heat dissipating structures are at least through the substrate and the semiconductor layer, and between the first ohmic contact and the second ohmic contact.

According to another aspect of the present disclosure, a semiconductor device is provided. The semiconductor device includes a substrate, a first semiconductor layer, a second semiconductor layer, a device layer, a through-substrate via (TSV) structure, and heat dissipating structures. The first semiconductor layer is over the substrate, the second layer semiconductor is over the first semiconductor layer, and the device layer is over the second semiconductor layer. The device layer includes a first ohmic contact and a second ohmic contact. The TSV structure is through the substrate, the first semiconductor layer, and the second semiconductor layer, and directly under the first ohmic contact. The heat dissipating structures are at least through the substrate and the first semiconductor layer, and between the first ohmic contact and the second ohmic contact.

According to yet another aspect of the present disclosure, a method of forming a semiconductor device is provided. The method includes forming a semiconductor layer over a substrate and forming a device layer over the semiconductor layer. The device layer includes a first ohmic contact and a second ohmic contact spaced apart from the first ohmic contact by a distance. A through-substrate via (TSV) structure and heat dissipating structures are formed at least through the substrate and the semiconductor layer. The TSV structure is electrically coupled to the first ohmic contact and the heat dissipating structures are arranged between the first ohmic contact and the second ohmic contact.

BRIEF DESCRIPTION OF THE DRAWINGS

The embodiments of the present disclosure will be better understood from a reading of the following detailed description, taken in conjunction with the accompanying drawings.

Figure 1:
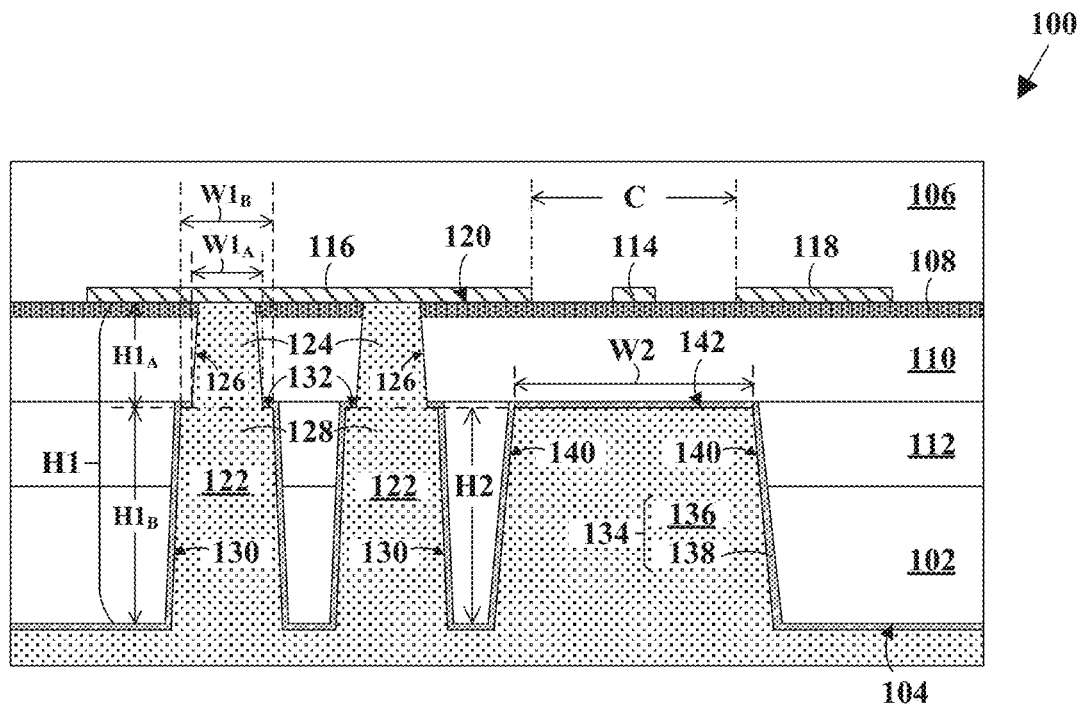
FIG. 1 illustrates a cross-sectional view of a transistor, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the disclosure.

Additionally, features in the drawings are not necessarily drawn to scale. For example, the dimensions of some of the features in the drawings may be exaggerated relative to other features to help improve understanding of embodiments of the device. The same reference numerals in different drawings denote the same features, while similar reference numerals may, but do not necessarily, denote similar features.

DETAILED DESCRIPTION

The present disclosure relates generally to high-electron-mobility transistors (HEMTs) with heat dissipation structures and methods of forming the same. Various embodiments of the present disclosure are now described in detail with accompanying drawings. It is noted that like and corresponding features are referred to by the use of the same reference numerals. The embodiments disclosed herein are exemplary, and not intended to be exhaustive or limiting to the disclosure.

Figure 2:
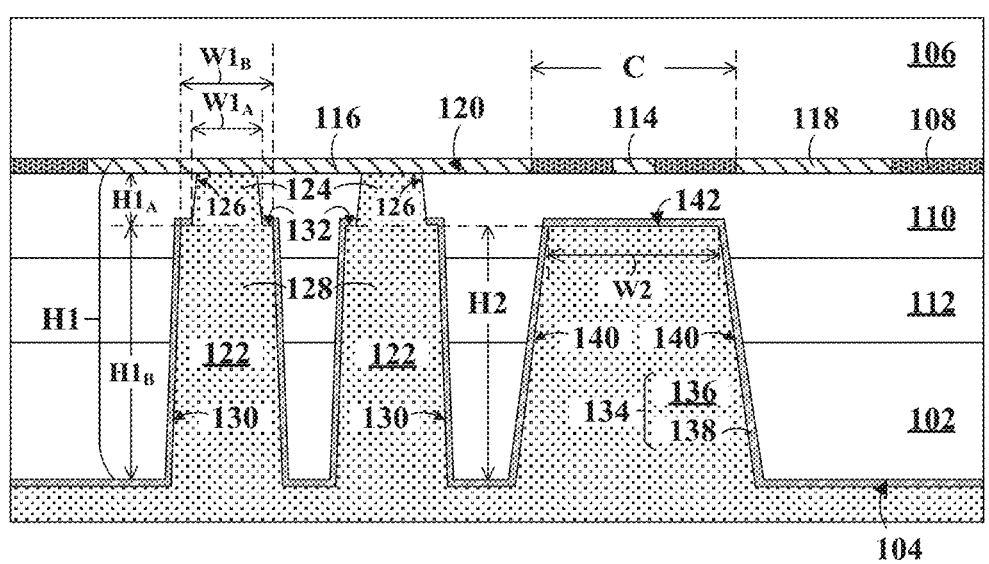
FIG. 2 illustrates an alternative embodiment of the transistor, according to an embodiment of the disclosure.

FIG. 1 illustrates a cross-sectional view of a transistor 100, according to an embodiment of the disclosure. FIG. 2 illustrates a cross-sectional view of the transistor 100, according to an alternative embodiment of the disclosure. The transistor 100 may function as a high-electron-mobility transistor (HEMT).

The transistor 100 may include a substrate 102 having a substrate surface 104. The substrate 102 may be a bulk substrate as illustrated in the accompanying drawings. Alternatively, the substrate 102 may be a composite substrate, for example, a semiconductor-on-insulator substrate or a semiconductor-on-ceramic substrate.

The substrate 102 may include a semiconductor material, for example, silicon, germanium, silicon germanium, silicon carbide, or other semiconductor compounds, such as group II-VI semiconductor compounds including zinc selenide, or group III-V semiconductor compounds, including gallium arsenide or gallium nitride. Alternatively, the substrate 102 may include sapphire, spinel, zinc oxide, aluminum nitride, or any other material capable of supporting the fabrication of a semiconductor material thereupon.

The transistor 100 may further include a device layer 106, a barrier layer 108, a channel layer 110, and a buffer layer 112 over the substrate 102. The device layer 106 may include various conductive features, for example, a gate structure 114 and interconnect structures (not shown), and various insulative features, for example, dielectric layers (not shown) and spacers (not shown).

The device layer 106 may further include an ohmic contact 116 and an ohmic contact 118 spaced apart from the ohmic contact. In an embodiment of the disclosure, the ohmic contacts 116, 118 may be arranged over the barrier layer 108, as illustrated in FIG. 1. The ohmic contacts 116, 118 may include bottom surfaces 120 in direct contact with the barrier layer 108. In another embodiment of the disclosure, the ohmic contacts 116, 118 may be arranged at least partially within the barrier layer 108. For example, the ohmic contacts 116, 118 may penetrate through the barrier layer 108, as illustrated in FIG. 2. The bottom surfaces 120 of the ohmic contacts 116, 118 may then be in direct contact with the channel layer 110. In another example, the ohmic contacts 116, 118 may be arranged partially within the barrier layer 108 such that a portion of the barrier layer 108 may be arranged under the ohmic contacts 116, 118, and the bottom surfaces 120 of the ohmic contacts 116, 118 may terminate within the barrier layer 108.

The ohmic contacts 116, 118 may function as either a source terminal or a drain terminal of the transistor 100, and the gate structure 114 may be arranged between the ohmic contacts 116, 118 in the device layer 106. In an embodiment of the disclosure, the ohmic contact 116 may function as a source terminal and the ohmic contact 118 may function as a drain terminal. Alternatively, the ohmic contact 116 may function as a drain terminal and the ohmic contact 118 may function as a source terminal.

The barrier layer 108 may be arranged under the device layer 106. The barrier layer 108 may include one or more layers of semiconductor material, for example, a group III-V semiconductor compound, including aluminum gallium arsenide or aluminum gallium nitride.

The channel layer 110 may be arranged under barrier layer 108. The channel layer 110 may include one or more layers of a semiconductor material having a lower band gap than that of the barrier layer 108. For example, the channel layer 110 may include a group III-V semiconductor compound, such as gallium arsenide, indium gallium arsenide, or gallium nitride. In an embodiment of the disclosure, the channel layer 110 may include the same semiconductor material as the substrate 102. Alternatively, the channel layer 110 may include a semiconductor material that is different from the semiconductor material of the substrate 102.

The interface between the barrier layer 108 and the channel layer 110 may provide a heterojunction, that results in the formation and confinement of a two-dimensional electron gas (2DEG) (not shown) at the interface. The 2DEG may be induced by polarization mismatches between the barrier layer 108 and the channel layer 110. The 2DEG may provide a conductive pathway between the ohmic contacts 116, 118 with increased carrier mobility. In an embodiment of the disclosure, the portion of the 2DEG between the ohmic contacts 116, 118 defines a channel region of the transistor 100, and the distance between the ohmic contacts 116, 118 may be referred to as the effective channel length C of the transistor 100.

The buffer layer 112 may be arranged between the substrate 102 and the channel layer 110. The buffer layer 112 may serve to accommodate any lattice mismatch between the substrate 102 and the channel layer 110, thereby improving the "on" state and "off" state electrical characteristics of the transistor 100. The buffer layer 112 may also serve to accommodate any strain and thermal expansion coefficients mismatch between the substrate 102 and the channel layer 110, thereby minimizing potential deformation of the substrate 102, such as bowing, warping, cracking, or breaking thereof. In an embodiment of the disclosure, the buffer layer 112 and the channel layer 110 may have substantially equal thicknesses. In another embodiment of the disclosure, the buffer layer 112 and the channel layer 110 may have a total thickness of about 2 micrometers (m) to about 5 µm.

The buffer layer 112 may include a semiconductor material that is different from the channel layer 110. For example, the buffer layer 112 may include a group III-V semiconductor compound, including aluminum nitride, aluminum gallium nitride, or gallium nitride. In an embodiment of the disclosure, the buffer layer 112 may include a single-layered structure. Alternatively, the buffer layer 112 may include a superlattice structure with multiple sublayers of group III-V semiconductor compounds, for example, alternating layers of aluminum nitride and gallium nitride.

The transistor 100 may further include a through-substrate via (TSV) structure 122 arranged through the substrate 102, the buffer layer 112, the channel layer 110, and the barrier layer 108. The TSV structure 122 may be arranged directly under and electrically coupled to the ohmic contact 116. The TSV structure 122 may serve as a vertical interconnection for the transistor 100, enabling the transistor 100 to be vertically stacked above and electrically coupled to another conductive feature, for example, a semiconductor device or a package to create three-dimensional integrated circuits or three-dimensional packages. The TSV structure 122 may include an electrically conductive material, for example, copper, gold, tungsten, tantalum, hafnium, titanium, silver, cobalt, or combinations thereof.

The TSV structure 122 may include a TSV portion 124 arranged through the barrier layer 108 and at least partially through the channel layer 110, and another TSV portion 128 arranged through the substrate 102 and at least partially through buffer layer 112; the transition of the TSV portion 124 to the TSV portion 128 is diagrammatically shown with a dash-dot-dot line for purposes of illustration. The TSV structure 122 may have a width dimension that varies along the length of its height H1. For example, the TSV portions 124, 128 may each taper (i.e., narrows) in a direction towards the device layer 106. In another example, the width dimensions of the TSV portions 124, 128 may increase with increasing distance from the device layer 106. In an embodiment of the disclosure, the sidewall 126 of the TSV portion 124 and the sidewall 130 of the TSV portion 128 may be substantially planar, though not necessarily coplanar with each other. In another embodiment of the disclosure, the width dimension of the TSV portion 124 and/or the width dimension of the TSV portion 128 may vary based on a linear function to provide a trapezoidal shape, though not necessarily the same linear function. In yet another embodiment of the disclosure, the width dimension of the TSV portion 124 and/or the width dimension of the TSV portion 128 may vary based on a non-linear function.

Alternatively, the TSV portions 124, 128 may each include substantially vertically straight sidewalls. Accordingly, the TSV portions 124, 128 may each have a substantially constant width dimension, and the width dimension of the TSV portion 124 may be narrower than the width dimension of the TSV portion 128.

The TSV structure 122 may include a step surface 132 that may be substantially parallel to the substrate surface 104. The step surface 132 may transition the TSV portion 124 to the TSV portion 128. For example, the TSV portion 124 may have a width $W1_A$ and the TSV portion 128 may have a width $W1_B$ at a plane substantially coplanar with the step surface 132, and the width $W1_A$ of the TSV portion 124 is narrower than the $W1_B$ of the TSV portion 128. In another example, the sidewall 126 of the TSV portion 124 may be arranged at an inward offset from the sidewall 130 of the TSV portion 128, and the step surface 132 may connect the sidewall 130 of the TSV portion 128 and the sidewall 126 of the TSV portion 124.

The step surface 132 of the TSV structure 122 may be arranged in the buffer layer 112 such that the TSV portion 124 may have a height $H1_A$ extending from the bottom surface 120 of the ohmic contact 116 to a level within the buffer layer 112. For example, the TSV portion 124 may terminate at a level below the interface between the channel layer 110 and the buffer layer 112, as illustrated in FIG. 1. The TSV portion 128 may have a height $H1_B$ extending from the TSV portion 124 (or the step surface 132) to the substrate surface 104.

Alternatively, as illustrated in FIG. 2, the step surface 132 of the TSV structure 122 may be arranged in the channel layer 110 such that the height $H1_A$ of the TSV portion 124 may extend from the bottom surface 120 of the ohmic contact 116 to a level within the channel layer 110. For example, the TSV portion 124 may terminate at a level above the interface between the channel layer 110 and the buffer layer 112. The height $H1_B$ of the TSV portion 128 may extend from the TSV portion 124 (or the step surface 132) to the substrate surface 104. In an embodiment of the disclosure, the height $H1_A$ of the TSV portion 124 is shorter than the height $H1_B$ of the TSV portion 128.

Even though FIG. 1 illustrates two TSV structures 122 being electrically coupled to the ohmic contact 116, it is understood that the number of TSV structures 122 may vary according to the design of the transistor, for example, a transistor may include one TSV structure 122 or more than two TSV structures 122.

The transistor 100 may yet further include heat dissipating structures 134, such as a bulk conductive structure 136 and a conductive liner 138. The heat dissipating structures 134 may serve as a passive heat spreader to dissipate heat from the transistor 100 when heat tends to be generated. The heat dissipating structures 134 may be arranged at least through the substrate 102 and the buffer layer 112. For example, a portion of the bulk conductive structure 136 and the conductive liner 138 may be in direct contact with the channel layer 110, as illustrated in FIG. 1. In another example, the bulk conductive structure 136 and a conductive liner 138 may be arranged through the substrate 102 and the buffer layer 112 and partially within the channel layer 110.

During the operation of the transistor 100, the ohmic contacts 116, 118 may be subjected to high bias conditions which may result in the generation of a large amount of heat in the channel layer 110, particularly in the 2DEG under the gate structure 114. As the buffer layer 112 may include materials having poor heat conductance, the large amount of heat generated may be trapped within the channel layer 110 and inadvertently causes the temperature in the channel layer 110 to rise. When the heat is not being efficiently and sufficiently removed therefrom, the transistor 100 may suffer from substantial degradation of electrical performance and reduction in reliability. By arranging the heat dissipating structures 134 in proximity to the region where heat tends to be generated, for example, the channel region, the heat accumulated during the operation of the transistor 100 may be effectively transferred to the heat dissipating structures 134 to be removed therefrom.

The bulk conductive structure 136 may be arranged at least through the substrate 102 and may be further arranged under and between the ohmic contacts 116, 118. The bulk conductive structure 136 may have a width W2 at the top surface 142 thereof. In an embodiment of the disclosure, the width W2 of the bulk conductive structure 136 may be at least as wide as the effective channel length C of the transistor 100. For example, as illustrated in FIGS. 1 and 2, the width W2 of the bulk conductive structure 136 may be wider than the effective channel length C of the transistor 100, and the side portions of the bulk conductive structure 136 may be arranged under the ohmic contacts 116, 118.

Alternatively, in another embodiment of the disclosure, the width W2 of the bulk conductive structure 136 may be narrower than the effective channel length C of the transistor 100, as illustrated in FIG. 2. The width W2 of the bulk conductive structure 136 may be significantly wider than the widths $W1_A$, $W1_B$ of the TSV structure 122 to provide sufficient thermal capacity to effectively function as a heat dissipating structure. In an embodiment of the disclosure, the width W2 of the bulk conductive structure 136 may be no wider than 10 μm.

The width dimension of the bulk conductive structure 136 may vary along the length of its height H2. For example, the bulk conductive structure 136 may taper (i.e., narrows) in a direction towards the device layer 106, and the width W2 of the bulk conductive structure 136 may be the minimum width thereof. In another example, the width dimensions of the bulk conductive structure 136 may increase with increasing distance from the device layer 106. In an embodiment of the disclosure, the sidewalls of the bulk conductive structure 136 may be substantially planar. In another embodiment of the disclosure, the width dimension of the bulk conductive structure 136 may vary based on a linear function to provide a trapezoidal shape. In yet another embodiment of the disclosure, the width dimension of the bulk conductive structure 136 may vary based on a non-linear function. Alternatively, the bulk conductive structure 136 may include substantially vertically straight sidewalls and may have a substantially constant width dimension along the length of its height.

The height H2 of the bulk conductive structure 136 may be substantially equal to the height $H1_B$ of the TSV structure 122. For example, the height H2 of the bulk conductive structure 136 may extend from the substrate surface 104 to a plane substantially coplanar with the step surface 132 of the TSV structure 122. As illustrated in FIG. 1, the top surface 142 of the bulk conductive structure 136 may terminate within the buffer layer 112. Alternatively, as illustrated in FIG. 2, the top surface 142 of the bulk conductive structure 136 may terminate within the channel layer 110. In an embodiment of the disclosure, the top surface 142 of the bulk conductive structure 136 may be substantially coplanar with the step surface 132 of the TSV structure 122.

The bulk conductive structure 136 may include an electrically conductive material, preferably one having a high thermal conductivity. In an embodiment of the disclosure, the bulk conductive structure 136 may include the same electrically conductive material as the TSV structure 122, as illustrated in FIGS. 1 and 2. In another embodiment of the disclosure, the bulk conductive structure 136 may include an electrically conductive material that is different from the TSV structure 122.

The conductive liner 138 may be arranged at least through the substrate 102. The conductive liner 138 may overlie the sidewalls 140 and the top surface 142 of the bulk conductive structure 136. The conductive liner 138 may be further arranged partially on the sidewalls of the TSV structure 122. For example, the conductive liner 138 may be arranged on the sidewalls of the TSV portion 128 and may overlie the step surface 132.

Additionally, the conductive liner 138 may overlie the substrate surface 104. The conductive liner 138 may have a substantially equal thickness. In an embodiment of the disclosure, the conductive liner 138 may have a thickness of no more than 0.1 µm.

The conductive liner 138 may effectively assist the bulk conductive structure 136 and the TSV structure 122 in dissipating heat from the transistor 100 while providing electrical isolation between adjacent conductive features, for example between the TSV structure 122 and the bulk conductive structure 136.

The conductive liner 138 may include a thermally conductive yet electrically insulative material, for example, a carbon-based material. Examples of a carbon-based material may include an elemental carbon material, such as diamond, or a carbon-based compound such as silicon carbide. As used herein, the term "elemental carbon material" includes not only a single-element carbon but may also include other trace elements in various alloyed combinations with carbon, as long as the chemical and physical properties of element carbon remain substantially unaffected. The conductive liner 138 may also include other thermally conductive yet electrically insulative materials, for example, aluminum oxide, aluminum nitride, boron nitride, or beryllium oxide.

Figure 3A:
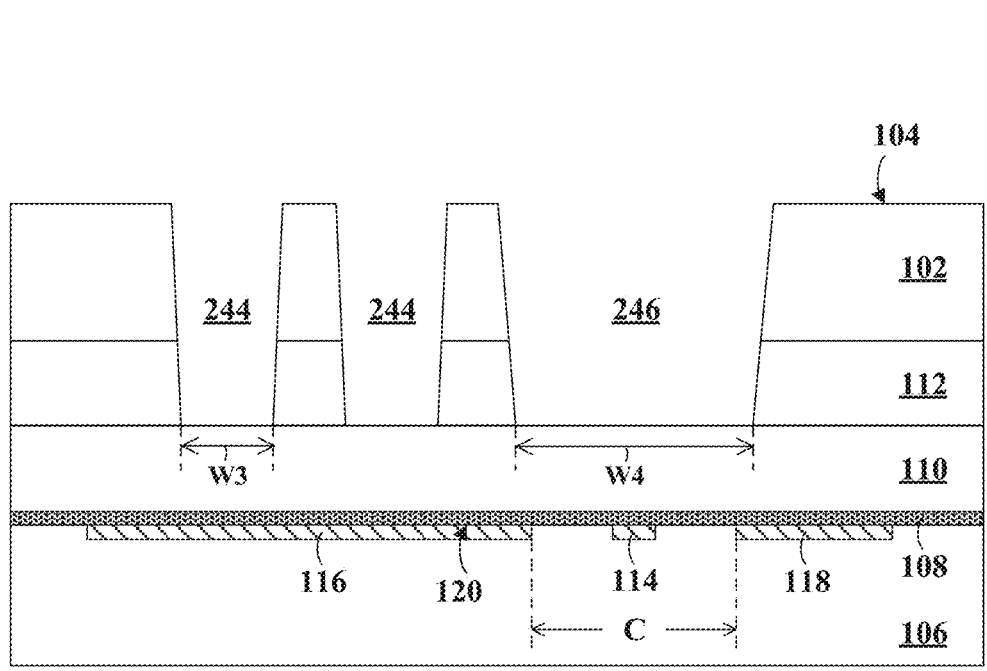
FIGS. 3A to 3C are cross-sectional views of a transistor, illustrating a method of forming heat dissipating structures therein, according to an embodiment of the disclosure.
Figure 3B:
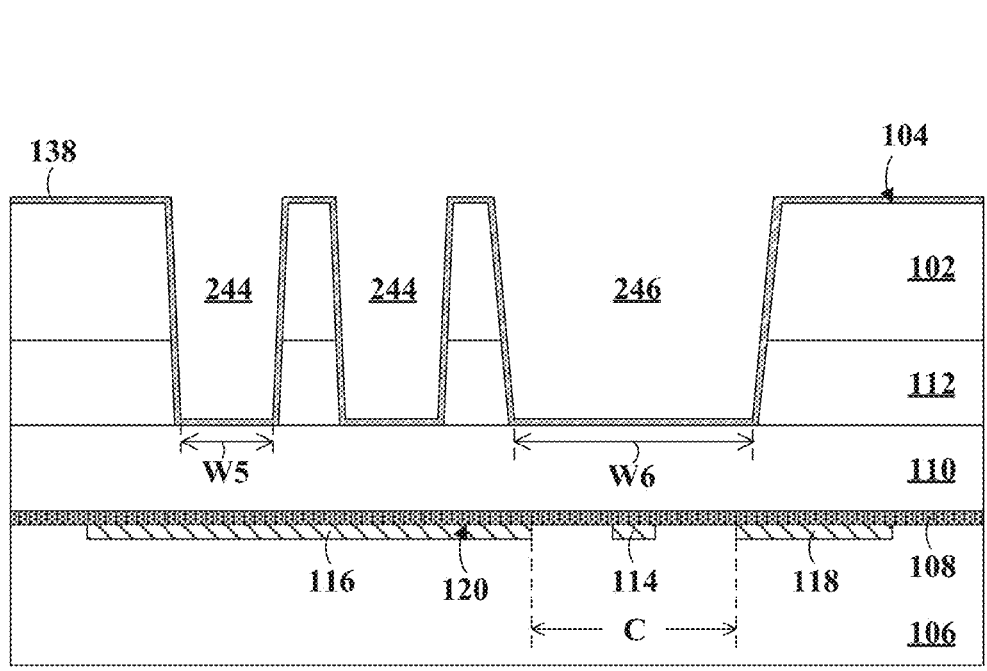
Figure 3C:
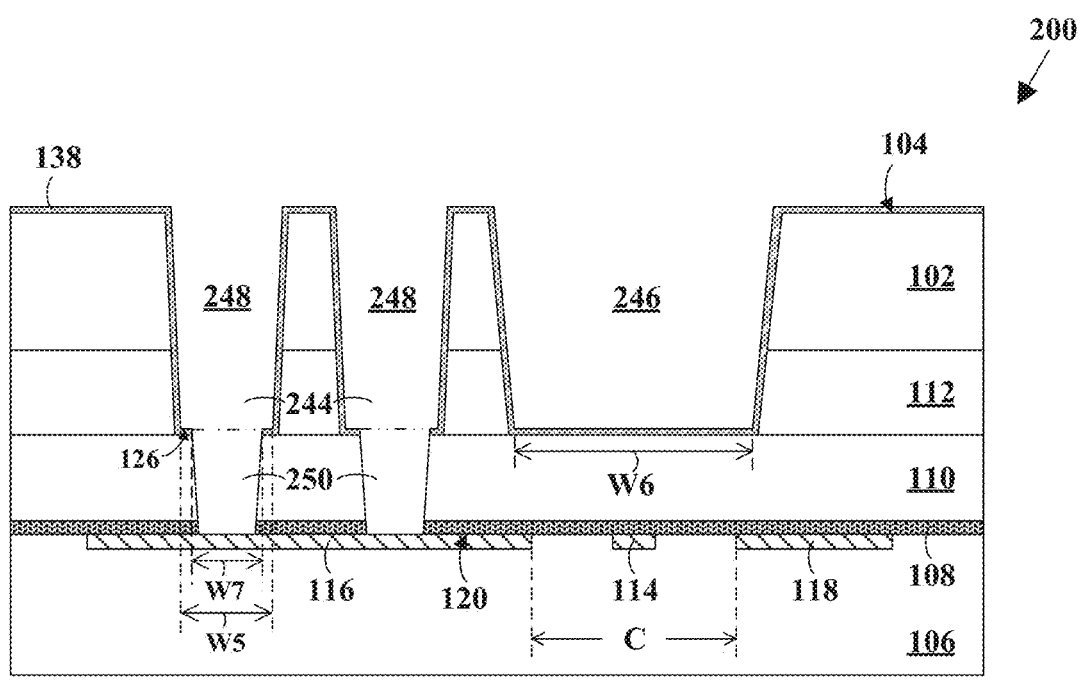

FIGS. 3A to 3C are cross-sectional views of a transistor 200, illustrating a method of forming heat dissipating structures therein, according to an embodiment of the disclosure. The transistor 200, in contrast to the transistor 100 in FIG. 1, may be arranged in a flipped configuration for the ease of fabrication of the heat dissipating structures. For example, the transistor 200 may be inverted such that the substrate surface 104 may be over the device layer 106. The transistor 200 may be similar to the transistor 100 in FIG. 1, and thus common features are labeled with the same reference numerals and need not be discussed. Certain structures may be conventionally fabricated, for example, using known processes and techniques, and specifically disclosed processes and methods may be used to achieve individual aspects of the present disclosure.

FIG. 3A illustrates the transistor 200 after forming openings 244, 246 at least through the substrate 102 and the buffer layer 112, according to an embodiment of the disclosure. The transistor 200 may have completed the fabrication of the device layer 106, including various conductive features, for example, a gate structure 114, interconnect structures, and ohmic contacts 116, 118, and various insulative features, for example, dielectric layers and spacers.

The substrate 102 may undergo a backside grinding process to thin down its thickness before forming the openings 244, 246. In an embodiment of the disclosure, the substrate 102 may have a thickness of about 50 µm to about 100 µm after the backside grinding process.

The openings 244, 246 may at least extend through the substrate 102 and the buffer layer 112 such that a portion of the channel layer 110 may be exposed in the openings 244, 246. For example, to form the transistor 100 in FIG. 1, the openings 244, 246 may extend from the substrate surface 104 and terminate at the interface between the channel layer 110 and the buffer layer 112. In another example, to form the transistor 100 in FIG. 2, the openings 244, 246 may extend from the substrate surface 104 and terminate within the channel layer 110.

The openings 244, 246 may be formed using a patterning technique, including lithography and etching processes. In an embodiment of the disclosure, the opening 244 may be formed concurrently with the opening 246. In another embodiment of the disclosure, the opening 244 may be formed in a separate fabrication step as the opening 246.

The openings 244, 246 may be arranged over the ohmic contacts 116, 118. For example, the opening 244 may be arranged directly above the ohmic contact 116 and the opening 246 may be arranged between the ohmic contacts 116, 118. The opening 244 may have a width W3 at the bottom surface thereof. The opening 246 may have a width W4 at the bottom surface thereof and the width W4 at least as wide as the effective channel length C of the transistor 200. For example, the width W4 of the opening 246 may be wider than the effective channel length C, and end portions of the ohmic contacts may be arranged directly under the opening 246. The width W4 of the opening 246 may be significantly wider than the width W3 of the opening 244. In an embodiment of the disclosure, the opening 244 may be an opening for a part of a TSV structure of the transistor 200. In another embodiment of the disclosure, the opening 246 may be an opening for a heat dissipating structure of the transistor 200.

FIG. 3B illustrates the transistor 200 after forming a conductive liner 138, according to an embodiment of the disclosure. The conductive liner 138 may be conformally deposited in the openings 244, 246, for example, the conductive liner 138 may be deposited on the sidewalls and bottom surfaces thereof. The conductive liner 138 may be further deposited on the substrate surface 104. As a result of the deposition of the heat dissipating liner 160 in the openings 244, 246, the effective width W3 of the opening 244 in FIG. 3A may be reduced to a width W5 that may be similar to the width $W1_B$ of the TSV portion 128 in FIG. 1. Similarly, the width W4 of the opening 246 in FIG. 3A may be reduced to a width W6 that may be similar to the width W2 of the bulk conductive structure 136 in FIG. 1. In an embodiment of the disclosure, the conductive liner 138 may have a thickness of no more than 0.1 µm.

The conductive liner 138 may include a thermally conductive yet electrically insulative material, for example, an elemental carbon material, such as diamond, or a carbon-based compound such as silicon carbide, aluminum oxide, aluminum nitride, boron nitride, or beryllium oxide. The conductive liner 138 may be deposited using a conformal deposition technique, including a chemical vapor deposition (CVD) process or an atomic layer deposition (ALD) process.

FIG. 3C illustrates the transistor 200 after forming a TSV opening 248, according to an embodiment of the disclosure. An opening 250 may be formed directly under the opening 244, extending through the channel layer 110 and the barrier layer 108; the transition of the opening 244 to the opening 250 is diagrammatically shown with a dash-dot-dot line for purposes of illustration. The opening 250 may expose a portion of the ohmic contact 116 therewithin. The opening 250 may be formed using a patterning technique, including lithography and etching processes. The openings 244, 250 may form the TSV opening 248 of the transistor 200. In an embodiment of the disclosure, the sidewalls of the openings 244, 250 may be substantially planar, though not necessarily coplanar with each other.

Additional fabrication steps may be performed before forming the opening 250, for example, forming one or more protection layers over the opening 246 that will be not subjected to the patterning technique.

The opening 250 may have a narrower width than the opening 244. For example, the TSV opening 248 may include a step surface 132 that transitions the opening 244 to the opening 250 such that the sidewalls of the opening 250 may be arranged at an inward offset from the sidewalls of the opening 244.

Processing continues with the deposition of one or more liner films (not shown) and the deposition of an electrically conductive material to at least fill the opening 246 and the TSV opening 248. The TSV opening 248 may be filled to form the TSV structure 122 and opening 246 may be filled to form the bulk conductive structure 136 in FIG. 1. The liner film may be deposited using a conformal deposition technique, including a CVD process, a physical vapor deposition (PVD) process, or an ALD process. The electrically conductive material may be deposited over the liner film using a deposition technique, including electroplating. The electrically conductive material may be deposited over the substrate surface 104 and may serve as a redistribution layer (RDL).

The one or more liner films may include barrier liner and/or adhesion liner, including titanium, tantalum, tantalum nitride, tantalum silicon nitride, tungsten, titanium nitride, or titanium silicon nitride. The electrically conductive material may include copper, tungsten, tantalum, hafnium, titanium, silver, cobalt, or combinations thereof.

The terms "top", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of features is not necessarily limited to those features but may include other features not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related.

Accordingly, a value modified by a term or terms, such as "approximately", "about,", "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of 90 degrees plus or minus a normal tolerance of the semiconductor industry.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way.

Rather, the above detailed description will provide those skilled in the art with a convenient road map for implementing an exemplary embodiment of the device, it being understood that various changes may be made in the function and arrangement of features and methods of fabrication described in an exemplary embodiment without departing from the scope of this disclosure as set forth in the appended claims.

What is claimed is:

1. A semiconductor device, comprising:
   a substrate;
   a semiconductor buffer layer over the substrate;
   a device layer over the semiconductor buffer layer, the device layer comprising a first ohmic contact and a second ohmic contact; and
   heat dissipating structures at least through the substrate and the semiconductor buffer layer, and between the first ohmic contact and the second ohmic contact.

2. The semiconductor device of claim 1, wherein the heat dissipating structures comprises:
   a bulk conductive structure; and
   a conductive liner conformally overlying the bulk conductive structure.

3. The semiconductor device of claim 2, wherein the first ohmic contact is spaced apart from the second ohmic contact by a distance, and the bulk conductive structure has a width that is at least as wide as the distance between the first ohmic contact and the second ohmic contact.

4. The semiconductor device of claim 2, wherein the first ohmic contact is spaced apart from the second ohmic contact by a distance, and the bulk conductive structure has a width that is narrower than the distance between the first ohmic contact and the second ohmic contact.

5. The semiconductor device of claim 2, wherein the conductive liner comprises a thermally conductive and electrically insulative material.

6. The semiconductor device of claim 5, wherein the thermally conductive and electrically insulative material comprises a carbon-based material.

7. The semiconductor device of claim 2, wherein the bulk conductive structure comprises an electrically and thermally conductive material.

8. A semiconductor device, comprising:
a substrate;
a semiconductor buffer layer over the substrate;
a semiconductor channel layer over the semiconductor buffer layer;
a device layer over the semiconductor channel layer, the device layer comprising a first ohmic contact and a second ohmic contact;
a through-substrate via (TSV) structure through the substrate, the semiconductor buffer layer, and the semiconductor channel layer, the TSV structure is directly under the first ohmic contact; and
heat dissipating structures at least through the substrate and the first semiconductor buffer layer, the heat dissipating structures are between the first ohmic contact and the second ohmic contact.

9. The semiconductor device of claim 8, wherein the TSV structure further comprising:
a lower TSV portion at least through the substrate and the semiconductor buffer layer;
an upper TSV portion over the lower TSV portion, the upper TSV portion is at least partially through the semiconductor channel layer and electrically coupled to the first ohmic contact; and
a step surface between the upper TSV portion and the lower TSV portion.

10. The semiconductor device of claim 9, wherein the lower TSV portion comprises a sidewall, the upper TSV portion comprises a sidewall, and the sidewall of the upper TSV portion is at an inward offset from the sidewall of the lower TSV portion.

11. The semiconductor device of claim 9, wherein the heat dissipating structures comprises:
a bulk conductive structure; and
a conductive liner, the conductive liner conformally overlying the bulk conductive structure and the lower TSV portion.

12. The semiconductor device of claim 11, wherein the bulk conductive structure has a top surface, and the top surface of the bulk conductive structure is substantially coplanar with the step surface of the TSV structure.

13. The semiconductor device of claim 11, wherein the bulk conductive structure comprises a conductive material and the TSV structure comprises a conductive material that is the same conductive material as the bulk conductive structure.

14. The semiconductor device of claim 8, wherein the first semiconductor buffer layer and the semiconductor channel layer comprise different group III-V semiconductor compounds.

* * * * *